United States Patent
Ryu

(10) Patent No.: US 8,692,321 B2
(45) Date of Patent: Apr. 8, 2014

(54) SEMICONDUCTOR DEVICE AND METHOD FOR FORMING THE SAME

(71) Applicant: SK hynix Inc., Icheon-si (KR)

(72) Inventor: Seong Wan Ryu, Yongin-si (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/722,728

(22) Filed: Dec. 20, 2012

(65) Prior Publication Data

US 2014/0048870 A1      Feb. 20, 2014

(30) Foreign Application Priority Data

Aug. 16, 2012  (KR) .................. 10-2012-0089572

(51) Int. Cl.
*H01L 29/66* (2006.01)

(52) U.S. Cl.
USPC .... 257/330; 257/284; 257/510; 257/E29.126; 257/E29.27; 438/270; 438/282

(58) Field of Classification Search
USPC ........... 257/330, 284, 510, E29.126, E29.27; 438/270, 282
See application file for complete search history.

(56) References Cited

U.S. PATENT DOCUMENTS

| 8,487,399 B2 * | 7/2013 | Cho et al. .................. 257/506 |
| 2008/0079076 A1 | 4/2008 | Sheen et al. |

FOREIGN PATENT DOCUMENTS

| KR | 100772114 B1 | 11/2007 |
| KR | 1020090114151 A | 11/2009 |

* cited by examiner

*Primary Examiner* — Tu-Tu Ho

(57) ABSTRACT

A semiconductor device includes a trench defined by etching a semiconductor substrate including a device isolation film and an active region, an active region protruded from a side and bottom of the trench, and a gate electrode surrounding the active region simultaneously while being buried in the trench.

11 Claims, 7 Drawing Sheets

(i)

(ii)

(i)

(ii)

SEMICONDUCTOR DEVICE AND METHOD FOR FORMING THE SAME

CROSS-REFERENCE TO RELATED APPLICATION

The priority of Korean patent application No. 10-2012-0089572 filed on 16 Aug. 2012, the disclosure of which is hereby incorporated in its entirety by reference, is claimed.

BACKGROUND OF THE INVENTION

Embodiments of the present invention relate to a semiconductor device and a method for forming the same, and more particularly to a semiconductor device including an extended fin-type active region, and a method for forming the same.

In recent times, as the design rule of highly-integrated MOSFET devices is gradually reduced, a channel length and width of each transistor are also reduced in proportion to the reducing design rule. In addition, doping density for a junction region is increased so that a junction leakage current caused by the increasing electric field is also increased. As a result, it is difficult for a transistor with a conventional planar channel structure to reach a threshold voltage value required in a highly-integrated semiconductor device and to improve refresh characteristics.

Therefore, people and developers are conducting research into a variety of ideas and fabrication technologies for forming a MOSFET element having a three-dimensional (3D) channel capable of extending the channel region.

For example, a fin transistor has recently been proposed as a transistor having a 3D channel in the latest logic element field. The fin transistor enables an active region to be protruded by etching a device isolation film, resulting in formation of a fin pattern. As a result, both side surfaces and upper surfaces of the active region are exposed, and a gate line is formed to surround the protruded part of the active region (fin pattern) so that the resultant fin transistor can be formed. In this case, a short channel effect caused by the increasing Drain Induced Barrier Lowering (DIBL) is restricted, and a channel is formed in each of the three exposed surfaces of the active region, so that current driving characteristics through such channels can be greatly improved.

However, while DIBL is reduced in such a fin transistor, it has a low threshold voltage, resulting in an increase in a leakage current of the semiconductor device. Another disadvantage of the conventional fin transistor is that a drive current is gradually reduced in inverse proportion to the increasing integration degree of the semiconductor device.

Although the problem caused by the reducing drive current can be solved by increasing the height of a fin pattern, pre and post fabrications become more difficult. For example, as the height of the fin pattern is increased, the loss of a device isolation film is also increased. That is, in order to facilitate gap-filling of a device isolation film, a flowable insulation film (also called a flowable dielectric film) such as a Spin On Glass (SOG) oxide film is buried in a lower end of a trench, and a High Density Plasma (HDP) oxide film is formed over the SOG oxide film. In the etching process for forming a subsequent fin pattern, the device isolation film is over-etched so that the SOG oxide film having a high wet-etching speed is exposed, resulting in deterioration of device isolation characteristics.

As the height of the fin pattern is increased, difficulty in a subsequent gate formation process is also increased. Assuming that the amount of lost device isolation film is increased in proportion to the height of a fin pattern, defective or poor etching occurs in the etching process for forming a subsequent gate pattern, causing short circuiting of gates, in which reduces gate line reliability.

Because the above-mentioned problems become more serious in proportion to the increasing integration degree of the semiconductor device, a solution for driving a drive current of a transistor without increasing a DIBL at the same threshold voltage and the same fin-pattern height is desirable.

BRIEF SUMMARY OF THE INVENTION

Various embodiments of the present invention are directed to providing a semiconductor device and a method for forming the same that substantially obviates one or more problems due to limitations and disadvantages of the related art.

An embodiment of the present invention relates to a semiconductor device for solving the related art problem in which a device isolation film is lost when a fin pattern is formed causing short-circuiting between gates, and a method for forming the semiconductor device.

In accordance with an aspect of the present invention, a semiconductor device includes: a trench formed in a device isolation film; an active region including an expanded end portion protruding from sidewalls and a bottom of the trench; and a gate electrode disposed over an upper surface and sidewalls of the expanded end portion and buried in the bottom of the trench.

A second width of the expanded end portion is greater than a first width of the active region.

The expanded end portion includes an expanded part with the second width, and a neck part with the first width between the expanded part and outer surfaces of the device isolation film defining a space between the expanded part and an outer surface of the device isolation film in the trench. Portions of the gate electrode are disposed in the space. A channel region is formed over sidewalls and upper surface of the expanded end portion.

In accordance with another aspect of the present invention, a method for forming a semiconductor device includes: forming a trench by etching a semiconductor substrate including a device isolation film and an active region; forming a first protrusion part by etching the device isolation film so that the active region protrudes from surfaces of the trench; forming a second protrusion part by growing the first protrusion part; forming an expanded end portion by etching portions of the device isolation film adjacent to the second protrusion part; forming a gate electrode over a bottom surface of the trench surrounding the expanded end portion.

The expanded end portion includes an expanded part with the second width, and a neck part with the first width between the expanded part and outer surfaces of the device isolation film defining a space between the expanded part and an outer surface of the device isolation film in the trench. The forming the first protrusion part includes anisotropically etching the device isolation film. The second protrusion part is grown by an epitaxial growth process.

The second protrusion part and the expanded end portion has a larger width than the active region. The forming the gate electrode includes:

It is to be understood that both the foregoing general description and the following detailed description of the present invention are exemplary and explanatory and are intended to provide further explanation of the invention as claimed.

BRIEF DESCRIPTION OF THE DRAWINGS

FIG. 1(i) is a cross-sectional view illustrating a semiconductor device, and FIG. 1(ii) is a perspective view illustrating the semiconductor device.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or similar parts. In the following description of the present invention, a detailed description of related known configurations or functions incorporated herein will be omitted when it may make the subject matter of the present invention rather unclear.

Figure 1:
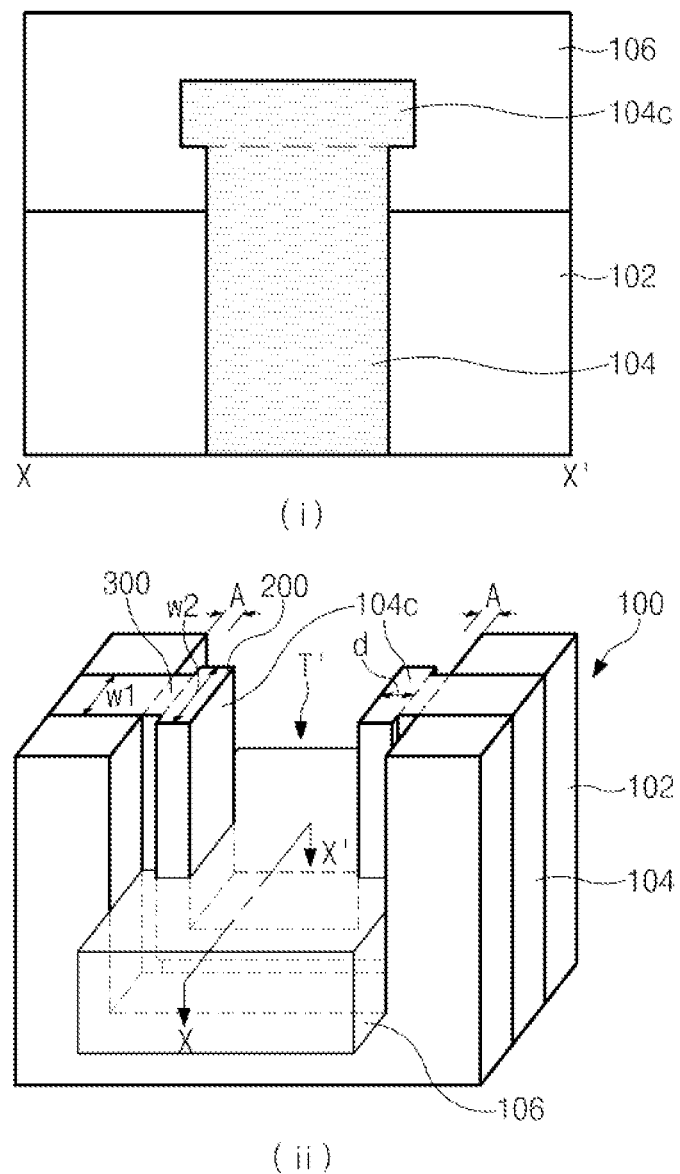
FIG. 1 illustrates a semiconductor device according to an embodiment of the present invention.

FIG. 1 illustrates a semiconductor device according to an embodiment of the present invention. FIG. 1(i) is a cross-sectional view illustrating a semiconductor device and FIG. 1(ii) is a perspective view illustrating the semiconductor device.

Referring to FIGS. 1(i) and 1(ii), the semiconductor device includes a trench T' defined by etching a semiconductor substrate including a device isolation film 102 and an active region 104, an expanded end portion 104c protruded from the side and bottom of the trench T', and a gate electrode 106 configured to surround the expanded end portion 104c and buried in the bottom of the trench T'. In an embodiment, trench T' is a line-type trench that crosses active region 104.

The expanded end portion 104c is contiguous with the active region 104, which may be a fin-type active region. However, as seen in FIG. 1, the expanded end portion 104c has a width W2 which is greater than the width W1 of the active region 104. An embodiment can also be described as having an active region 104 having a first width W1, and an expanded end portion 104c having a second width W2 greater than the first width W1. The first width of active region 104 may be substantially the same at a portion of the active region 104 adjacent to the expanded end portion 104c, so that the combination of the active region 104 and the expanded end portion 104c has a "T" shape.

In an alternate embodiment of the structure of FIG. 1, the expanded end portion 104c includes an expanded part 200 with the second width, and a neck part 300 with the first width between the expanded part and outer surfaces of the device isolation film defining a space between the expanded part 200 and an outer surface of the device isolation film in the trench. Thus, the exposed neck part 300 between the expanded part 200 and surface planes of the trench can be described as part of expanded end portion 104c. As seen in FIG. 1, the space has a width A.

The gate electrode 106 surrounds the expanded end portion 104c so that a channel region extends along the surface of the expanded end portion 104c. Accordingly, a short channel effect of the semiconductor device may be reduced and drive capability of a current can be improved.

A method for forming a semiconductor device having the above-mentioned elements will hereinafter be described with reference to FIGS. 2A to 2E.

FIGS. 2A to 2E sequentially illustrate methods for forming a semiconductor device. In each of FIGS. 2A to 2E, (i) is a cross-sectional view of the semiconductor device, and (ii) is a perspective view illustrating the semiconductor device.

Figure 2A:
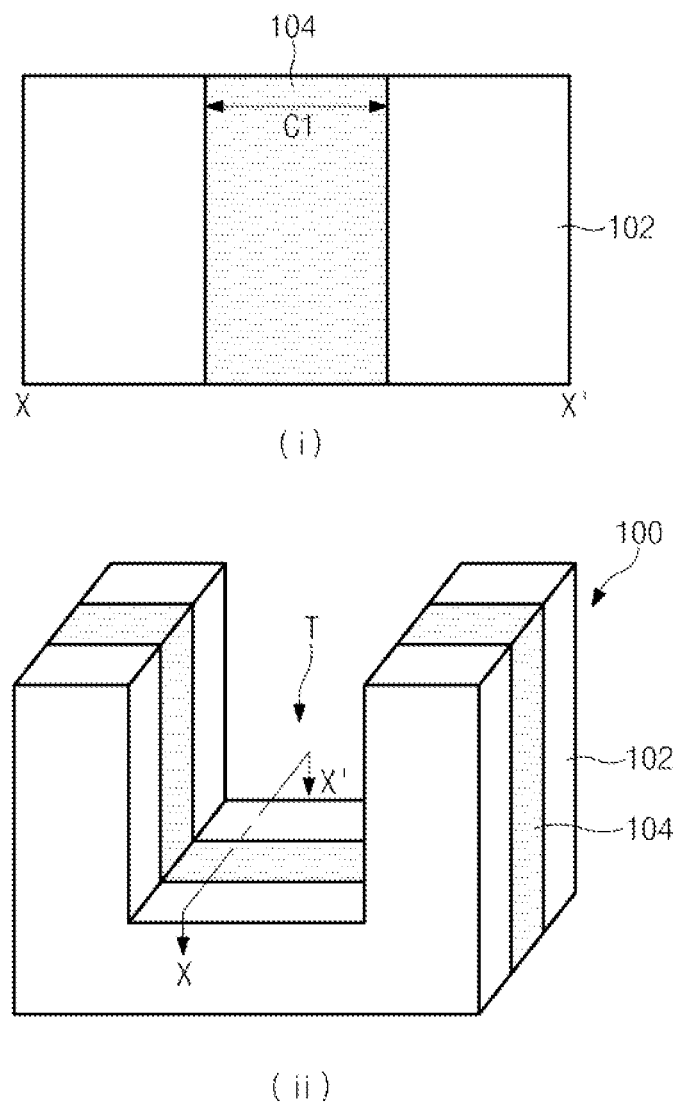
FIGS. 2A to 2E sequentially illustrate methods for forming a semiconductor device. In each of FIGS. 2A to 2E, (i) is a cross-sectional view illustrating the semiconductor device, and (ii) is a perspective view illustrating the semiconductor device.

Referring to FIG. 2A, a semiconductor substrate 100 includes an active region 104 defined by a device isolation film 102. In an embodiment, the device isolation film 102 can be formed using the following method. A pad oxide film and a pad nitride film are formed over the semiconductor substrate 100. Subsequently, the pad nitride film, the pad oxide film and the semiconductor substrate 100 are etched so that a device-isolation trench is formed over the semiconductor substrate. Subsequently, after an oxide film is deposited to fill the trench, the oxide film is planarized with chemical mechanical polishing (CMP), and the pad nitride film and the pad oxide film are etched so that a device isolation film 102 defining the active region is formed. Thereafter, the device isolation film 102 and the active region 104 are etched so that a trench T defining a buried gate is formed.

Figure 2B:
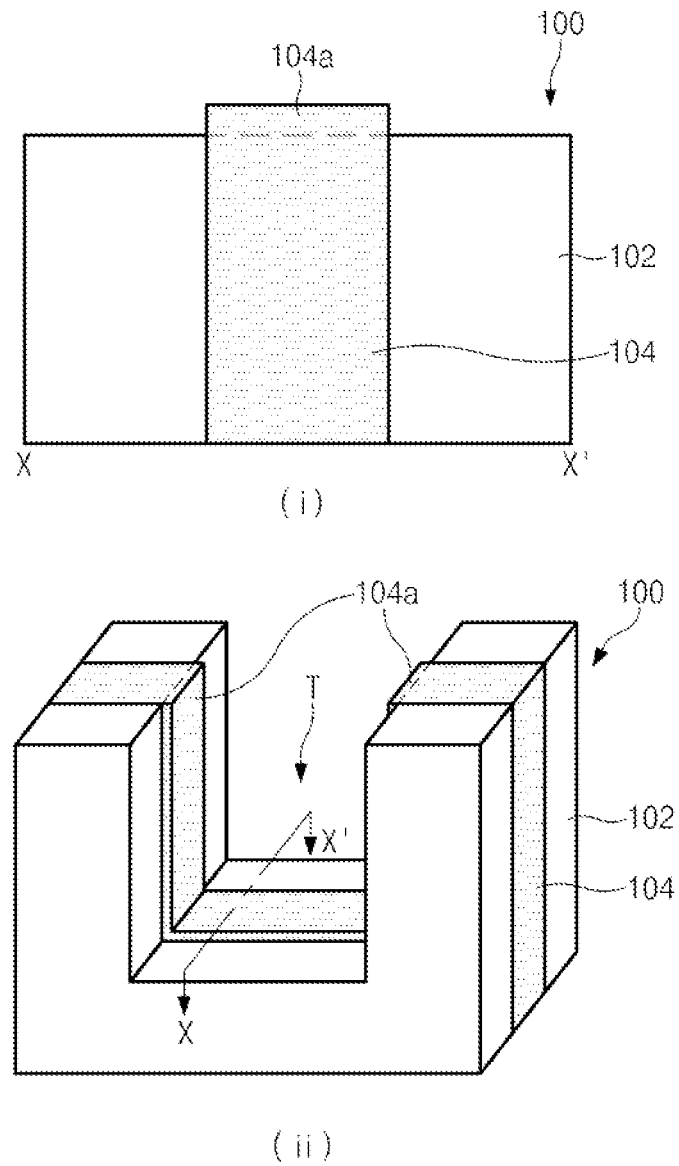

Referring to FIG. 2B, the device isolation film 102 is etched so that a portion of active region 104 protrudes from the device isolation film 102, resulting in formation of a first protrusion part 104a. In an embodiment, the device isolation film 102 may be anisotropically etched. The first protrusion part 104a may be formed to protrude from both sidewalls and the bottom of the trench T.

Figure 2C:
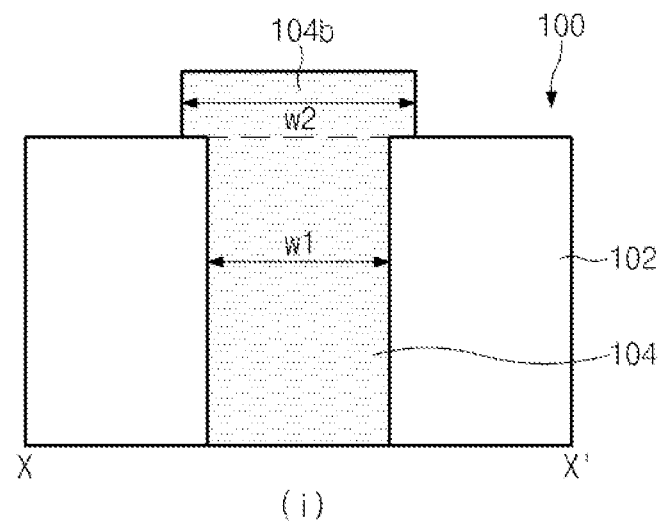
Figure 2C:
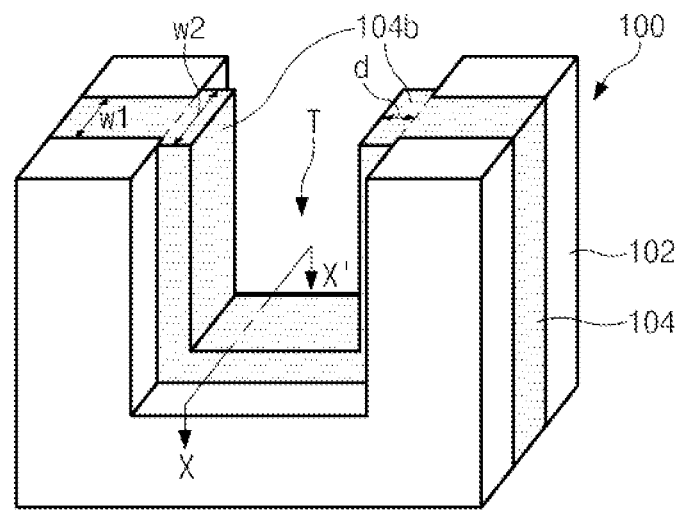

Referring to FIG. 2C, selective epitaxial growth is performed on the first protrusion part 104a so that a second protrusion part 104b is formed. In an embodiment, the second protrusion part 104b may be formed to overlap surfaces of the device isolation film 102 that form sidewalls and the bottom of trench T. Therefore, the second protrusion part 104b has a larger width W2 than width W1 of the first protrusion part 104a and the active region 104 disposed between isolation regions 102. In an embodiment, second protrusion part 104b has a greater depth (d) than the first protrusion part 104a. The second protrusion part 104b is also formed over both sidewalls and the bottom of the trench T.

Figure 2D:
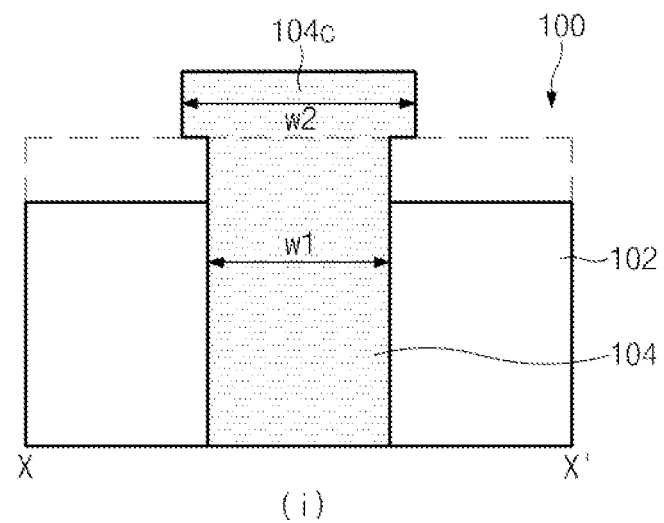
Figure 2D:
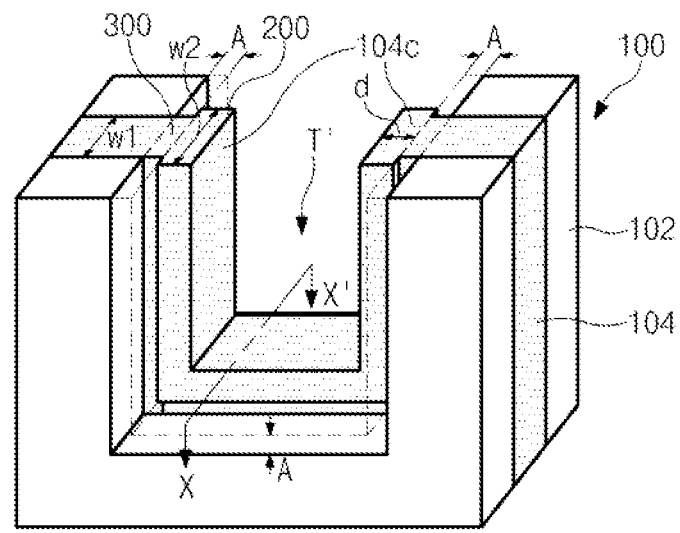

Referring to FIG. 2D, portions of the device isolation film 102 adjacent to the second protrusion part 104b are etched and removed, resulting in formation of the expanded end portion 104c. For example, assuming that the device isolation film 102 is etched to remove material with a thickness of A, the width of trench T' is extended by a thickness of 2 A compared to a width of the trench T, and the depth of trench T' is greater than the depth of trench T by a thickness of A. The expanded end portion 104c may include part of the active region 104 exposed by etching the trench. In an embodiment, an anisotropic etching process is used to remove the device isolation film 102.

Figure 2E:
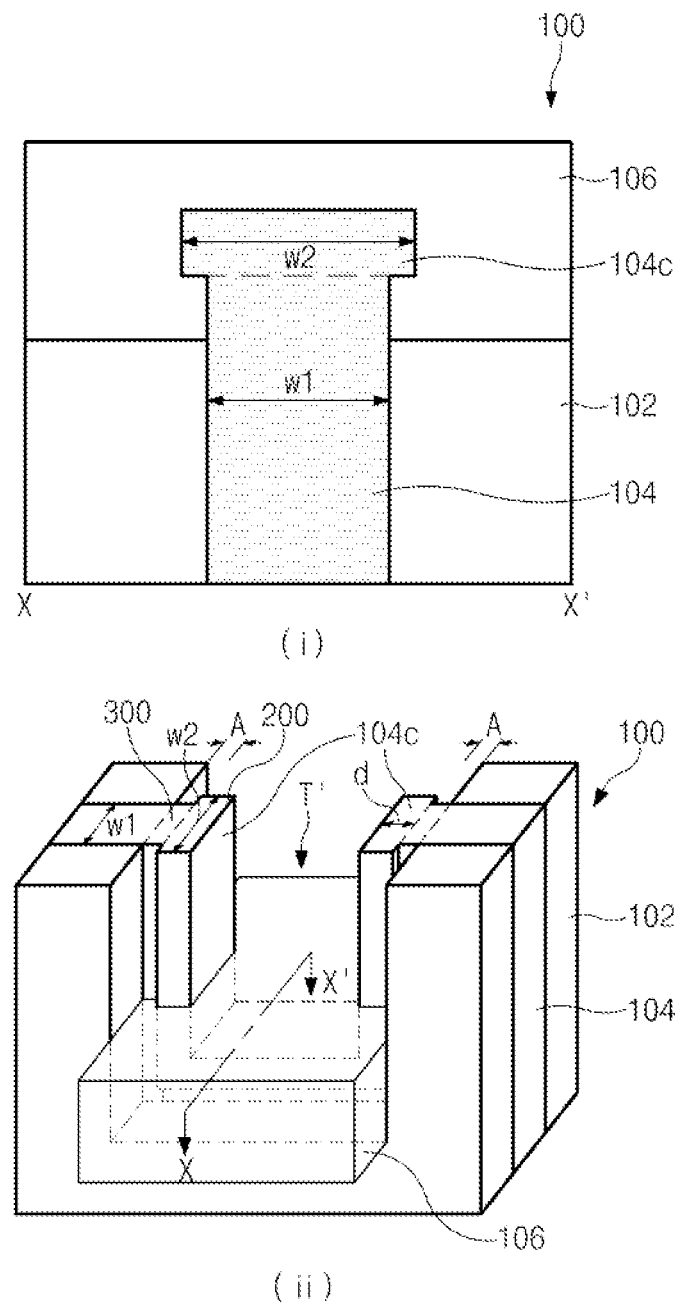

Referring to FIG. 2E, after forming a metal layer over the semiconductor substrate 100 including the trench T', the metal layer is etched back so that a gate electrode 106 is formed to be buried in the bottom of the trench T'. In an embodiment, the gate electrode 106 may be formed over all exposed surfaces of expanded end portion 104c, including filling the space between outer surfaces of trench T' and the expanded end portion 104c indicated by A on FIG. 2E. As a result, a channel region is extended as will now be described with reference to FIG. 3.

Figure 3:
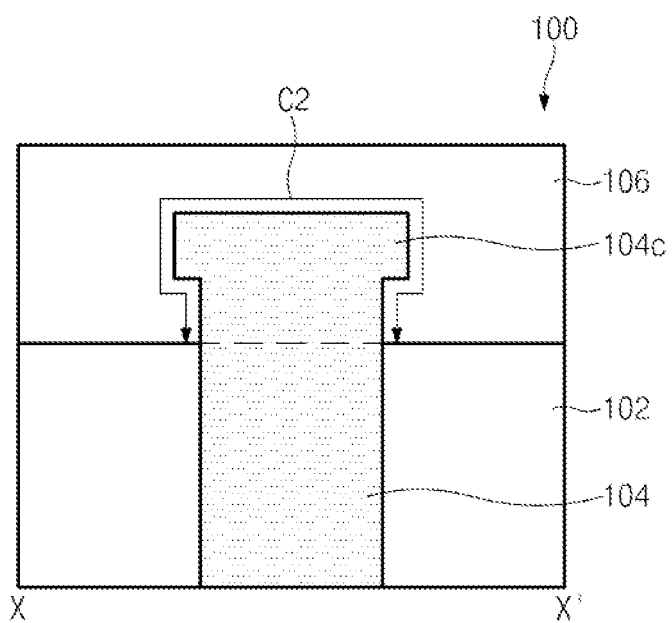
FIG. 3 is a cross-sectional view illustrating a channel region according to the embodiments of the present invention.

FIG. 3 is a cross-sectional view illustrating a channel region according to the embodiments of the present invention. A conventional gate electrode is coupled only to the surface (See FIG. 2A) of the active region 104 protruded from the device isolation film 102, so that a channel region C1 is formed over the protruded active region 104. However, as shown in FIG. 3, the gate electrode according to the embodiment is formed to surround the expanded end portion 104c, so that a channel region C2 is formed over the surface of the expanded end portion 104c. Therefore, a channel length of embodiments of the present invention is longer than that of the related art. As a result, embodiments of the present invention can reduce a short channel effect while improving current drive capability.

As described above, in an embodiment of the present invention, an active region defined by a device isolation film is grown through an epitaxial growth method, the device isolation film is etched in such a manner that an active region is exposed by a predetermined amount corresponding to the amount of etched device isolation film, so that an expanded end portion elongated from the active region is defined. A buried gate is formed in the trench over the expanded end portion, and the buried gate is formed around outer surfaces of the expanded end portion, so that a channel length increases and a short channel effect is reduced, resulting in improvement of the current drive capability.

As is apparent from the above description, the embodiments of the present invention form an expanded end portion protruded from an upper part of the device isolation film, so that a gate drive current is increased and a channel length is also increased. Embodiments of the present invention include a fin transistor in a semiconductor device.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A semiconductor device comprising:
   a trench formed in a device isolation film;
   an active region including an expanded end portion protruding from sidewalls and a bottom of the trench; and
   a gate electrode disposed over an upper surface and sidewalls of the expanded end portion and buried in the bottom of the trench.

2. The semiconductor device according to claim 1, wherein a second width of the expanded end portion is greater than a first width of the active region.

3. The semiconductor device according to claim 2, wherein the expanded end portion includes an expanded part with the second width, and a neck part with the first width between the expanded part and outer surfaces of the device isolation film defining a space between the expanded part and an outer surface of the device isolation film in the trench.

4. The semiconductor device according to claim 3, wherein portions of the gate electrode are disposed in the space.

5. The semiconductor device according to claim 1, wherein a channel region is formed over sidewalls and upper surface of the expanded end portion.

6. A method for forming a semiconductor device comprising:
   forming a trench by etching a semiconductor substrate including a device isolation film and an active region;
   forming a first protrusion part by etching the device isolation film so that the active region protrudes from surfaces of the trench;
   forming a second protrusion part by growing the first protrusion part;
   forming an expanded end portion by etching portions of the device isolation film adjacent to the second protrusion part; and
   forming a gate electrode over a bottom surface of the trench surrounding the expanded end portion.

7. The method according to claim 6, wherein the expanded end portion includes an expanded part with the second width, and a neck part with the first width between the expanded part and outer surfaces of the device isolation film defining a space between the expanded part and an outer surface of the device isolation film in the trench.

8. The method according to claim 6, wherein forming the first protrusion part includes anisotropically etching the device isolation film.

9. The method according to claim 8, wherein the second protrusion part is grown by an epitaxial growth process.

10. The method according to claim 6, wherein the second protrusion part and the expanded end portion has a larger width than the active region.

11. The method according to claim 6, wherein forming the gate electrode includes:
    burying a metal layer in the trench; and
    etching back the metal layer.

* * * * *